United States Patent
Hsieh et al.

(10) Patent No.: US 10,714,187 B2
(45) Date of Patent: Jul. 14, 2020

(54) MEMORY CONTROL DEVICE FOR ESTIMATING TIME INTERVAL AND METHOD THEREOF

(71) Applicant: RAYMX Microelectronics Corp., Anhui province (CN)

(72) Inventors: Yi-Lin Hsieh, Changhua (TW); Jing-Long Xiao, Tainan (TW); Cheng-Yu Chen, New Taipei (TW); Wang-Sheng Lin, New Taipei (TW)

(73) Assignee: RAYMX MICROELECTRONICS CORP., Anhui Province (CN)

( * ) Notice: Subject to any disclaimer, the term of this patent is extended or adjusted under 35 U.S.C. 154(b) by 0 days.

(21) Appl. No.: 16/679,476

(22) Filed: Nov. 11, 2019

(65) Prior Publication Data

US 2020/0075104 A1 Mar. 5, 2020

Related U.S. Application Data

(63) Continuation-in-part of application No. 16/136,492, filed on Sep. 20, 2018, now Pat. No. 10,566,065.

(30) Foreign Application Priority Data

Jan. 11, 2018 (TW) .............................. 107101095 A

(51) Int. Cl.
*G11C 7/00* (2006.01)
*G11C 16/14* (2006.01)
*G11C 16/32* (2006.01)

(52) U.S. Cl.
CPC .............. *G11C 16/14* (2013.01); *G11C 16/32* (2013.01)

(58) Field of Classification Search
CPC .................................. G11C 16/14; G11C 16/32
USPC .......................................................... 365/218
See application file for complete search history.

(56) References Cited

U.S. PATENT DOCUMENTS

| 6,049,488 | A  | 4/2000  | Sawada |
| 7,809,515 | B2 | 10/2010 | Zhou |
| 7,949,910 | B2 | 5/2011  | Kanno et al. |
| 8,156,393 | B2 | 4/2012  | Nagadomi et al. |

(Continued)

FOREIGN PATENT DOCUMENTS

| CN | 104679441 A | 6/2015 |
| TW | I380302 B | 12/2012 |

(Continued)

OTHER PUBLICATIONS

TW Office Action dated Apr. 26, 2014 in Taiwan application (No. 107101095).

*Primary Examiner* — Viet Q Nguyen
(74) *Attorney, Agent, or Firm* — McClure, Qualey & Rodack, LLP

(57) ABSTRACT

A memory control device includes a memory and a controller. The memory includes a plurality of memory blocks. The controller is coupled to the memory and configured to select a first memory block from the memory blocks and program data into the first memory block. When the memory control device is deactivated and re-activated, the controller is further configured to read a voltage distribution of the first memory block to determine a deactivation interval, and determine a reference time according to the deactivation interval and an initial time, and the voltage distribution of the first memory block correspond to the data.

18 Claims, 5 Drawing Sheets

(56) References Cited

U.S. PATENT DOCUMENTS

| | | | |
|---|---|---|---|
| 8,644,099 B2* | 2/2014 | Cometti | G11C 16/26 |
| | | | 365/185.18 |
| 9,230,639 B2* | 1/2016 | Ish-Shalom | G11C 16/20 |
| 9,263,136 B1* | 2/2016 | Zhao | G11C 16/10 |
| 9,355,738 B2* | 5/2016 | Im | G11C 16/349 |
| 9,432,298 B1 | 8/2016 | Smith | |
| 9,721,669 B2 | 8/2017 | Chu et al. | |
| 9,805,812 B2 | 10/2017 | Kwak | |
| 10,223,029 B2* | 3/2019 | Gorobets | G06F 3/0634 |
| 10,566,065 B2* | 2/2020 | Hsieh | G11C 16/16 |
| 2002/0181301 A1 | 12/2002 | Takahashi | |
| 2004/0051549 A1 | 3/2004 | Matsuzaki | |
| 2007/0159900 A1 | 7/2007 | Aoki | |
| 2010/0091535 A1* | 4/2010 | Sommer | G11C 16/28 |
| | | | 365/45 |
| 2010/0287314 A1 | 11/2010 | Perry | |
| 2013/0159610 A1 | 6/2013 | Kawamura | |
| 2013/0173987 A1 | 7/2013 | Grube | |
| 2014/0226412 A1 | 8/2014 | Yeh | |
| 2014/0235954 A1 | 8/2014 | Mohajer-Shojaee | |
| 2015/0340099 A1 | 11/2015 | Kwak | |
| 2020/0090766 A1* | 3/2020 | Tokutomi | G11C 29/52 |

FOREIGN PATENT DOCUMENTS

| | | |
|---|---|---|
| TW | I386808 B | 2/2013 |
| TW | I554886 B | 10/2016 |

* cited by examiner

MEMORY CONTROL DEVICE FOR ESTIMATING TIME INTERVAL AND METHOD THEREOF

RELATED APPLICATIONS

This application is a Continuation-in-part of U.S. patent application Ser. No. 16/136,492 filed Sep. 20, 2018, now U.S. Pat. No. 10,566,065, which claims the benefit of priority to Taiwan Application Serial Number 107101095, filed Jan. 11, 2018, which is herein incorporated by reference.

BACKGROUND

Technical Field

The present disclosure relates to a memory technology. More particularly, the present disclosure relates to a memory control device and a memory control method.

Description of Related Art

Due to the manufacturing process of NAND flash memory, internal data stored in the memory may be failure if the memory is not powered for a long time. However, in a situation where the power is off, a controller for controlling the memory cannot record timing information due to lack of a reference clock, and thus a deactivation interval of the memory cannot be obtained. If an additional real time clock (RTC) circuit is integrated or an external clock circuit is employed, cost would be increased and additional standby power would be needed.

SUMMARY

An aspect of the present disclosure is to provide a memory control device that includes a memory and a controller. The memory includes a plurality of memory blocks. The controller is coupled to the memory and configured to select a first memory block from the memory blocks and program data into the first memory block. When the memory control device is deactivated and re-activated, the controller is further configured to read a voltage distribution of the first memory block to determine a deactivation interval, and determine a reference time according to the deactivation interval and an initial time, and the voltage distribution of the first memory block correspond to the data.

An aspect of the present disclosure is to provide a memory control method, which is applied to a memory control device. The memory control method includes: selecting, by a controller, a first memory block from a plurality of memory blocks of a memory, and programming data into the first memory block; and reading, by the controller, a voltage distribution, corresponding to the data, of the first memory block to determine a deactivation interval when the memory control device is deactivated and reactivated, and determining a reference time according to the deactivation interval and an initial time.

As described above, without integrating with additional circuits or external circuits, the controller is able to determine the deactivation interval and the current reference time of the memory control device according to the voltage distribution the selected memory block.

BRIEF DESCRIPTION OF THE DRAWINGS

This disclosure can be more fully understood by reading the following detailed description of the embodiment, with reference made to the accompanying drawings as follows.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present embodiments. Furthermore, for simplifying the drawings, some of the conventional structures and elements are shown with schematic illustrations.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other.

Figure 1:
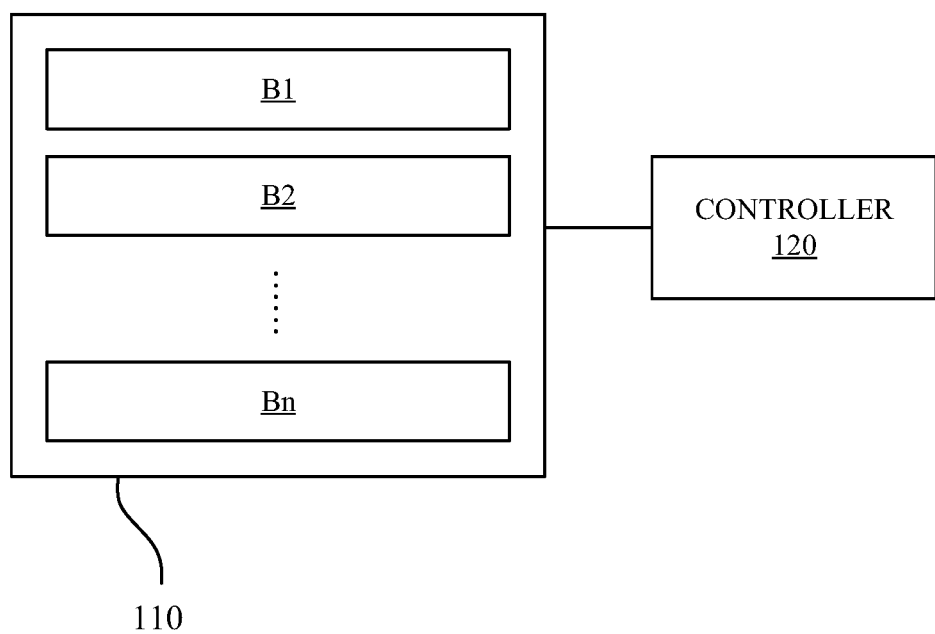
FIG. 1 is a schematic diagram of a memory control device according to some embodiments of some embodiments of the present disclosure.
Figure 2:
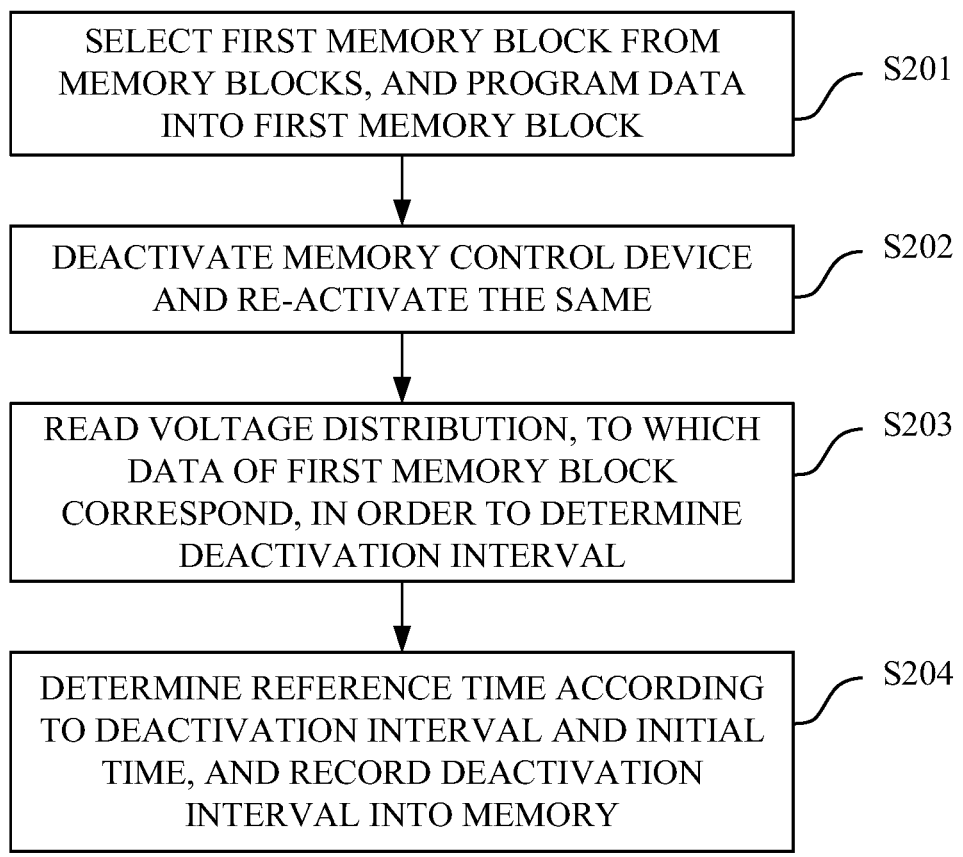
FIG. 2 is a flow chart of a memory control method according to some embodiments of the present disclosure.

Reference is now made to FIGS. 1 and 2. FIG. 1 is a schematic diagram of a memory control device 100 according to some embodiments of some embodiments of the present disclosure. FIG. 2 is a flow chart of a memory control method 200 according to some embodiments of the present disclosure. The memory control method 200 includes operation S201-S204, which are able to be applied to the memory control device 100 in FIG. 1. It is understood that the operations described in the embodiments are not necessarily performed in the order described below. The order of the operations of the memory control method 200 can be changed, or the operations can be executed simultaneously or partially simultaneously as appropriate, in accordance with the spirit and scope of various embodiments of the present disclosure. The memory control device 100 includes a memory 110 and a controller 120. The memory 110 includes memory blocks B1-Bn. Each of the memory blocks B1-Bn may include memory cells. The memory 110 is coupled to the controller 120. In some embodiments, the memory 110 may be NAND flash memory.

In operation S201, the controller 120 selects one memory block from the memory blocks B1-Bn, and programs data into the selected memory block.

Figure 4:
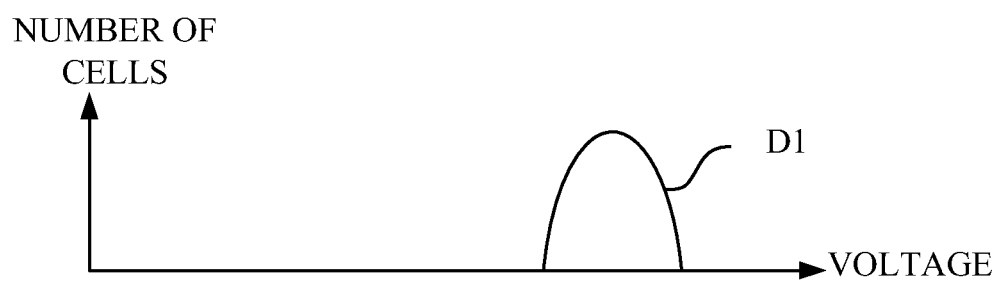
FIG. 4 is a schematic diagram illustrating voltage distribution of the first memory block according to some embodiments of the present disclosure.

For example, the controller 120 selects the memory block B1 and programs data to the same. It is noted that the data written into the memory block B1 may have a specific data type, such that internal memory cells of the memory blocks B1 are pulled up to a specific voltage (i.e., the voltage distribution under this condition is D1, as shown in FIG. 4). In an embodiment, the data is a predetermined value, for example all 1s.

Alternatively, in some other embodiments, the controller 120 may also select other one or more memory blocks (not limited to the memory block B1) to program data.

In some embodiments, the memory control device 100 may be applied to a solid state disk (SSD). The controller 120 may be a controller of the SSD. The controller 120 may program data into the memory block B1 during an initial procedure of the SSD, and may receive an initial time from an external device (e.g., an initial system being connected). The controller 120 may record this initial time into the memory 110.

In operation S202, the memory control device 100 is deactivated and reactivated. For example, a SSD, to which the memory control device 100 is applied, may be disconnected from a system terminal (e.g., a computer) and may be re-connected with the system terminal after a certain time. In other words, in the above progress, the memory control device 100 is deactivated (i.e., disconnected from the system terminal) and re-activated (i.e., re-connected with the system terminal).

In operation S203, when the memory control device 100 is reactivated, the controller 120 reads the voltage distribution of the memory block B1, in order to determine a deactivation interval of the memory control device 100 (which is referred to as a time difference between the previous operation and the current operation). It is noted that, the voltage, corresponding to the data programmed into the memory block B1 in operation S201 may be reduced, and the variation of the voltage distribution is associated with the deactivation interval of the memory control device 100.

Figure 5:
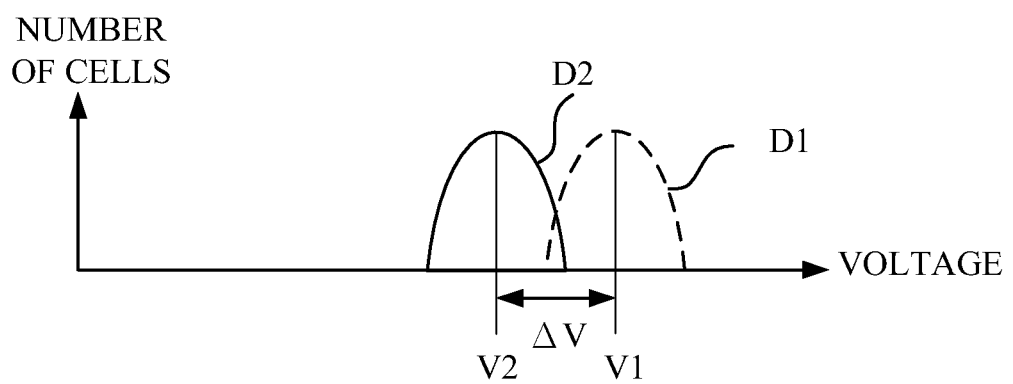
FIG. 5 is a schematic diagram illustrating voltage distribution of the first memory block according to some embodiments of the present disclosure.

For example, as shown in FIG. 5 below, the voltage distribution of the memory block B1 is varied from the voltage distribution D1 to a voltage distribution D2, and the voltage of the memory cells of the memory block B1 is reduced from a voltage V1 to a voltage V2 (i.e., a voltage difference $\Delta V$ is present between the voltages V1 and V2). The controller 120 may determine the deactivation interval according to the voltage distribution of the memory block B1 being read. For example, the controller 120 may determine the deactivation interval of the memory control device 100 according to the voltage distribution of the memory block B1 by using an algorithm. In another example, the controller 120 may determine the deactivation interval of the memory control device 100 according to the voltage distribution of the memory block B1 by using a lookup table. The voltage V1 (V2) is a representative value of the voltage distribution D1 (D2). In an embodiment, the voltage V1 (V2) can be one of peak voltage, average voltage, maximum voltage, and minimum voltage to respective the voltage distribution D1 (D2).

In operation S204, the controller 120 determine a reference time according to the deactivation interval and the initial time. It is noted that, according to the initial time received in the initial procedure and the determined deactivation interval, the controller 120 may determine the current reference date (i.e., the reference time) of the SSD. It is further noted that, in a situation where the memory control device 100 is deactivated serval times, the controller 120 may repeat performing operations S202-S204 to determine each of the deactivation intervals of the memory control device 100, and may sum up all of the deactivation intervals according to the initial time to determine the current reference date (i.e., the reference time) of the memory control device 100.

Accordingly, the controller 120 is able to determine the deactivation interval and the current reference time of the memory control device 100 according to the voltage distribution of the selected memory block B1 without integrating with additional circuits or external circuits.

Figure 3:
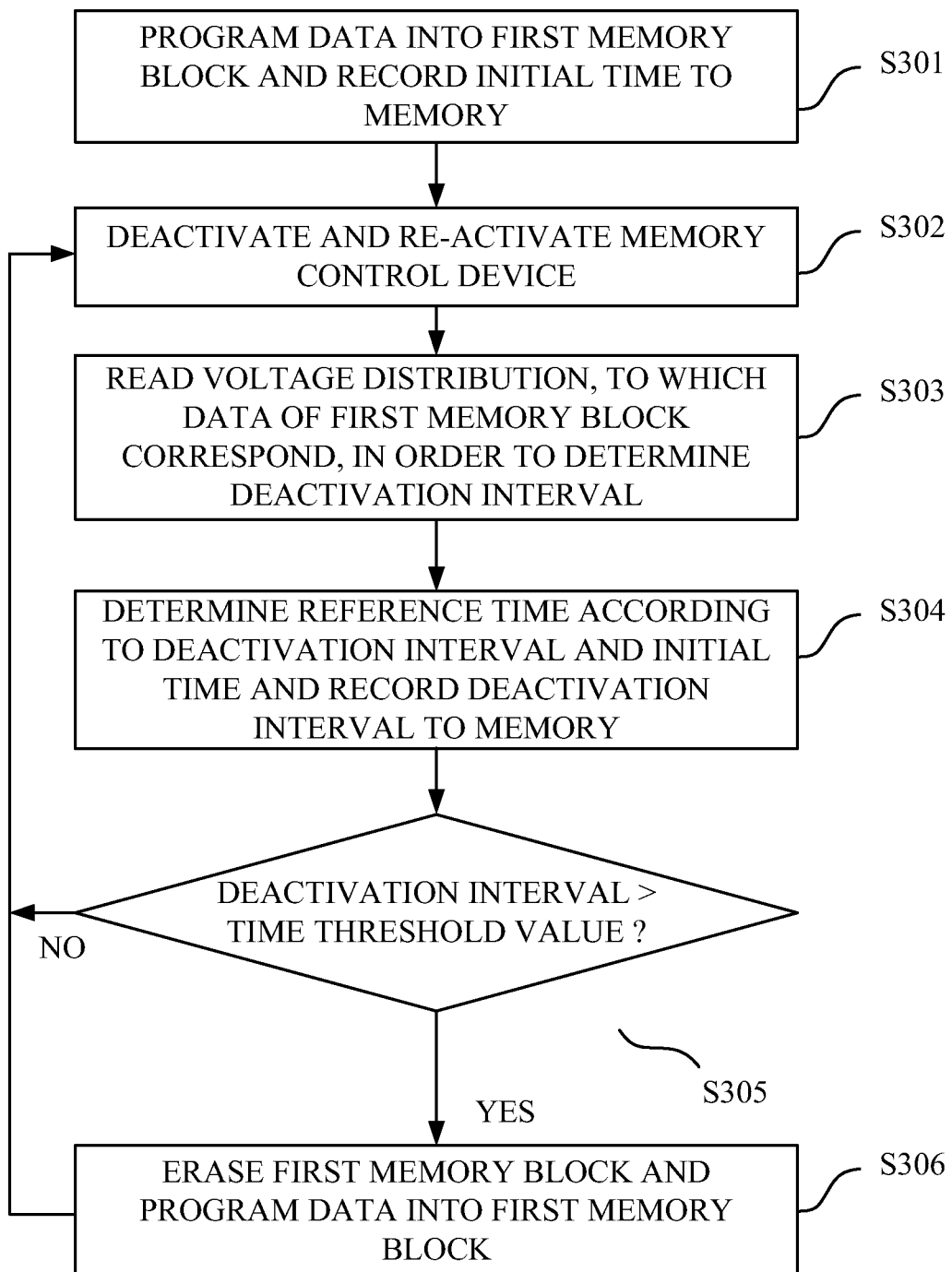
FIG. 3 is a flow chart of a memory control method according to some embodiments of the present disclosure.

In some embodiments, the controller 120 is further configured to determine whether to erase the memory block and to program the data into the memory block B1 according to the deactivation interval and a time threshold value. Reference is now made to FIG. 3. FIG. 3 is a flow chart of a memory control method 300 according to some embodiments of the present disclosure. The memory control method 300 includes operations S301-S306, which may be applied to the memory control device 100 in FIG. 1. It is understood that the operations described in the embodiments are not necessarily performed in the order described below. The order of the operations of the memory control method 300 can be changed, or the operations can be executed simultaneously or partially simultaneously as appropriate, in accordance with the spirit and scope of various embodiments of the present disclosure.

In operation S301, the controller 120 programs data into the memory block B1, and records the initial time into the memory 110. As described above, for example, the controller 120 may program the data into the memory block B1 and record the initial time into the memory 110.

The operations S302-S304 are similar to the operation S202-204, and thus the repetitious descriptions are not further given herein.

In operation S305, the controller 120 determines whether the deactivation interval is longer than a time threshold value (which may be designed according to practical requirements).

If the controller 120 determines that the deactivation interval is longer than the time threshold value in operation S305, the controller 120 erases the memory block B1 and programs data into the same (i.e., operation S306). It is noted that, if the controller 120 determines that the deactivation interval is longer than the time threshold value, it is indicated that the voltage corresponding to data in the memory block B1 may be too low to determine the deactivation interval accurately. Thus, the controller 120 may erase the data, which correspond to low voltage, in the memory block B1, and re-program the data into the memory block B1, in order to accurately determine the deactivation interval in operations S302-S303.

Alternatively, if the controller 120 determines that the deactivation interval is not longer than the time threshold value in operation S305, it is indicated that the data programmed into the memory block B1 are still sufficient to be used to accurately determine the deactivation interval in operations S302-S303.

As a result, the controller 120 is able to timely update the data of the memory block B1, in order to accurately determine the current reference time of the SSD to which the memory control device 100 is applied.

Alternatively, in some other embodiments, the controller 120 may selects multiple memory blocks from the memory blocks B1-Bn in operation S301, and program data into the selected memory blocks. For example, the controller 120 may select 8 memory blocks from the memory blocks B1-Bn and program the data into the selected 8 memory blocks. Whenever the memory control device 100 is deactivated and re-activated (i.e., operation S302), the controller 120 erases one of the 8 memory blocks in operation S303, programs data into the erased memory block, and reads the voltage distributions of other blocks of the 8 memory blocks, in order to determine the deactivation interval of the memory control device 100.

It is noted that the controller 120 may calculate an operation value (e.g., an average value) of the deactivation interval according to the deactivation intervals, to which the voltage distributions of the other memory blocks of the 8 memory blocks correspond, as the deactivation interval of the memory control device 100. Accordingly, the memory control device 100 is able to ensure that at least one memory block is sufficient to be employed to accurately determine the deactivation interval at each re-activation.

In some embodiments, the controller 120 is further configured to determine whether to perform a maintain operation on the memory 110 according to the deactivation interval. For example, if the controller 120 determines that the deactivation interval is longer than a predetermined value (e.g., one year, but the present disclosure is not limited thereto), the controller 120 may perform the maintain operation on the memory (e.g., moving data, charging, etc.), in order to extend the lifespan of the memory.

As described above, without integrating with additional circuits or external circuits, the controller 120 is able to determine the deactivation interval and the current reference time of the memory control device 100 according to the voltage distribution the selected memory block B1.

Various functional components or blocks of the memory control device 100 have been described herein. As will be appreciated by persons skilled in the art, in some embodiments, the functional blocks may be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A memory control device, comprising:
   a memory comprising a plurality of memory blocks; and
   a controller coupled to the memory and configured to select a first memory block from the memory blocks and program data into cells of the first memory block to obtain a first voltage distribution across cells of the first memory block, thereby generating a first voltage value representative of the first voltage distribution, wherein the controller is configured to obtain a second voltage distribution across the cells of the first memory block after an actual time interval to thereby generate a second voltage value representative of the second voltage distribution, and the controller is configured to estimate the actual time interval based on a difference between the first and the second voltage values to generate an estimated time interval.

2. The memory control device of claim 1, wherein the controller is further configured to determine whether to erase the first memory block and to program the data into the cells of the first memory block according to the estimated time interval and a time threshold value.

3. The memory control device of claim 1, wherein the memory control device is deactivated and re-activated in the actual time interval.

4. The memory control device of claim 1, wherein the controller is configured to determine whether to perform a maintain operation on the memory according to the estimated time interval.

5. The memory control device of claim 1, wherein the controller is configured to record an initial time to the memory when the data is programmed into the cells of the first memory block.

6. The memory control device of claim 5, wherein the controller is further configured to sum up the estimated time interval and the initial time to determine a reference time.

7. The memory control device of claim 1, wherein the controller is further configured to record the estimated time interval to the memory.

8. The memory control device of claim 1, wherein the data is a predetermined value.

9. The memory control device of claim 1, wherein the first voltage value is one of a peak value, an average value, a maximum value, and a minimum value of the first voltage distribution.

10. A memory control method, applied to a memory control device, and the memory control method comprising:
    selecting, by a controller, a first memory block from a plurality of memory blocks of a memory, programming data into cells of the first memory block; and
    obtaining, by the controller, a first voltage distribution across the cells in the first memory block to thereby determine a first voltage value representative of the first voltage distribution;
    after an actual time interval, obtaining, by the controller, a second voltage distribution across the cells in the first memory block to thereby determine a second voltage value representative of the second voltage distribution; and
    estimating, by the controller, the actual time interval based on a difference between the first and the second voltage values to generate an estimated time interval.

11. The memory control method of claim 10, further comprising:
    determining, by the controller, whether to erase the cells of the first memory block and program the data to the cells of the first memory block according to the estimated time interval.

12. The memory control method of claim 10, wherein the memory control device is deactivated and re-activated in the actual time interval.

13. The memory control method of claim 10, further comprising:
    determining, by the controller, whether to perform a maintain operation on the memory according to the estimated time interval.

14. The memory control method of claim 10, further comprises:
    summing up, by the controller, the estimated time interval and an initial time to determine a reference time.

15. The memory control method of claim 10, further comprising:

recording, by the controller, an initial time to the memory when the data is programmed into the cells of the first memory block.

16. The memory control method of claim 10, further comprising:

recording, by the controller, the estimated time interval to the memory.

17. The memory control method of claim 10, wherein the data is a predetermined value.

18. The memory control method of claim 10, wherein the first voltage value is one of a peak value, an average value, a maximum value, and a minimum value of the first voltage distribution.

* * * * *